United States Patent [19]

Yamamoto

[11] Patent Number: 4,639,377

[45] Date of Patent: Jan. 27, 1987

[54] THIN FILM FORMATION TECHNIQUE AND EQUIPMENT

[75] Inventor: Shigehiko Yamamoto, Tokorozawa, Japan

[73] Assignee: Hitachi, Ltd., Tokyo, Japan

[21] Appl. No.: 725,793

[22] Filed: Apr. 22, 1985

[30] Foreign Application Priority Data

Apr. 24, 1984 [JP] Japan .................................. 59-81121

[51] Int. Cl.$^4$ .............................................. B05D 3/06
[52] U.S. Cl. ...................................... 427/10; 118/688;
118/689; 118/690; 118/691; 118/720; 118/721;
118/723; 118/726; 156/DIG. 103; 156/601;
156/611; 219/271; 219/272; 427/38; 427/248.1
[58] Field of Search ............... 118/726, 723, 720, 721,
118/688, 689, 690, 691; 156/DIG. 103, 611,
601; 219/271, 272; 427/10, 248.1, 38

[56] References Cited

U.S. PATENT DOCUMENTS

| | | | |
|---|---|---|---|
| 2,341,827 | 2/1944 | Sukumlyn | 118/720 X |
| 3,906,889 | 9/1975 | Omura et al. | 118/690 X |
| 4,543,467 | 9/1985 | Eisele et al. | 118/726 X |

OTHER PUBLICATIONS

Pamplin, ed. "Molecular Beam Epitaxy", Pergamon Press, 1980, pp. 23-30.
Chang et al, "The Growth of a GaAs—GaAlAs Super Lattice", *J. Vac. Sci. Technol.*, vol. 10, No. 1, Jan./Feb. 1973, pp. 11-16.

*Primary Examiner*—Bernard D. Pianalto
*Attorney, Agent, or Firm*—Antonelli, Terry & Wands

[57] ABSTRACT

A thin film formation technique and apparatus therefor which comprises converting a molecular beam effusing from a molecular beam source equipment to a pulsed molecular beam; introducing the pulsed molecular beam into an ionization chamber in such a fashion that the most of the pulsed molecular beam is caused to be incident to a substrate while a part is ionized by the ionization chamber; amplifying the ion or the electron converted from the ion and converting it to an electrical signal; calculating the flux and speed of the molecular beam; controlling the molecular beam effusing from the molecular beam source equipment on the basis of the calculation information; and forming the thin film on the substrate.

11 Claims, 3 Drawing Figures

THIN FILM FORMATION TECHNIQUE AND EQUIPMENT

BACKGROUND OF THE INVENTION

This invention relates to a thin film formation technique and equipment that can control the flux and speed of a molecular beam.

In accordance with a conventional thin film formation technique, a desired material is placed in a boat-like container and is then heated so that the material atoms are evaporated and stuck on a substrate prepared in advance, and thickness control of the thin film is made using a quartz oscillator or the like disposed close to the substrate. Where control of film thickness with a high level of resolution is necessary such as in a molecular beam epitaxy equipment, a Knudsen cell has been often used as a molecular beam source (evaporation source) of the element. In the Knudsen cell, the total molecular beam flux is determined if the temperature of the molecular source is set, and since the spatial distribution of effusion follows a Cosine Law, the molecular beam flux reaching the substrate is determined if the geometrical structure is determined. In this case, a quartz oscillator is conjointly used for monitor. (See, for example, S. Yamamoto et al., J. Appl. Phys. 46 (1975) 406).

However, the thin film formation technique described above does not directly measure the molecular beam reaching the substrate, so that the technique can not control the energy or speed of the molecular beam. Furthermore, since the mutual relation between the quantity of the molecular beam reaching the substrate and the quantity of the molecular beam participating in the film formation, that is, sticking probability, is not clear, control of film thickness can not be made completely.

SUMMARY OF THE INVENTION

It is a primary object of the present invention to provide a thin film formation technique and equipment which measures the flux and speed of a molecular beam used for the thin film formation, feeds them back to molecular beam source equipment and can control the thickness of the film to be formed.

In a thin film formation method which sticks a molecule to a substrate and forms a thin film, the above and other objects of the present invention can be accomplished by a thin film formation technique and equipment characterized in that a molecular beam effusing from a molecular beam source equipment is converted to a pulse-like beam, the pulsed molecular beam is then introduced into an ionization chamber, the most of the beam is permitted to be incident to the substrate while a part of the beam is ionized by the ionization chamber, the ion or electron converted from the ion is amplified and is changed into an electric signal so as to calculate the flux and speed of the molecular beam, and a thin film is formed while the molecular beam effusing from the molecular beam source equipment is controlled on the information on the flux and speed.

DESCRIPTION OF THE PREFERRED EMBODIMENTS

The present invention will be described with reference to the accompanying drawings.

Figure 1:
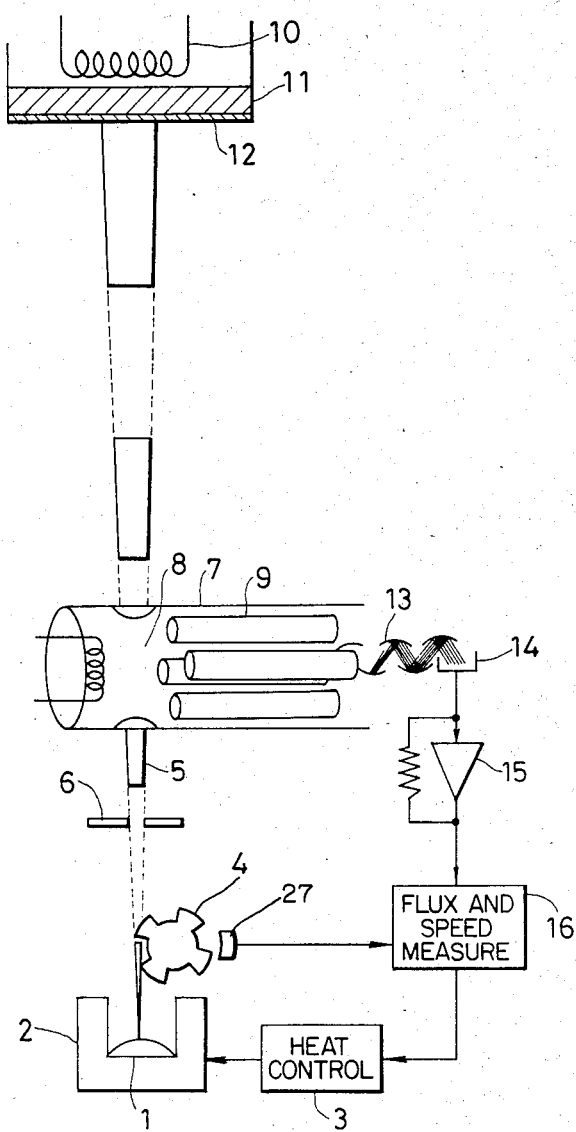
FIG. 1 is a schematic view showing an example of the thin film formation equipment in accordance with the present invention.

FIG. 1 shows an example of the thin film formation equipment in the present invention. FIG. 2 is a perspective view showing a molecular beam speed selector, wherein symbol (a) represents a selector using two choppers and (b) represents a selector using a cylindrical chopper. Referring to FIG. 1, a material 1 of an element for forming a thin film is stored in a heating container 2, and is heated by the heat of a passing current while being controlled by a heating controller 3. The material may be heated by electron bombardment heating. The molecular beam effusing from the heating container 2 due to heating is turned ON and OFF by a toothed disc called "chopper" 4 at a speed that can be neglected in conjunction with the film formation, and is converted to a pulsed molecular beam 5. After its expansion is restricted by an aperture 6, the pulsed molecular beam 5 reaches the ion source 8 (a region forming the ion) of a quadrupole mass spectrometer 7, and a part of the pulsed molecular beam 5 is ionized by the ion source 8 and is subjected to mass spectroscopy by the quadrupole 9 of the quadrupole mass spectrometer 7. Most of the molecular beam that is not ionized by the ion source 8 of the quadrupole mass spectrometer 7 travels as such, and sticks to the surface of a substrate 11 kept at a suitable temperature by a heater 10, thereby forming a thin film 12. The substrate 11 can rotate and can also cause linear motion so that the thin film 12 can be formed uniformly on the surface of the substrate 11.

The ion inside the quadrupole mass spectrometer 7 is converted to an electron, is then amplified by about $10^6$ times through a multiplier 13, and is collected by a collector 14. The current of this collector 14 is converted to an electrical signal by a current-voltage transformer 15 and is sent to a flux and speed measurement device 16, and the output of a photo-sensor 27, which detects the timing of the chopper 4 described above, is used as a reference signal for this flux and speed measurement device. A phase sensitive detector or a multichannel analyzer is used for the measurement of the flux and the speed, and the flux and the speed are calculated by a microcomputer on the basis of the result of mass spectroscopy. The output of the flux and speed measurement device 16 is fed back to the heating controller 3, so that the molecular beam can be emitted under a pre-set condition, and the thickness of the thin film 12 can be controlled. When the molecular beam is emitted by the electron bombardment heating, the output of the flux and speed measurement device 16 is fed back to electron bombardment type heating equipment to control its power.

When a compound or a mixture is used as the material 1 and the thickness of the thin film is controlled, too, the quadrupole mass spectrometer 7 is used in the same way as in the embodiment described above and the mass spectroscopy if carried out for each element of the material 1 on the time series basis. The result of the mass spectroscopy is sent to the flux and speed measurement device 16, and the output based upon the flux and the speed can thus be fed back to the heating controller 3.

Though the embodiment described above uses the mass spectrometer as the ion source, any equipment can also be used so long as they can ionize the molecular beam.

In the thin film formation equipment described above, the proportion of the ionized molecule to the total flux of the molecular beam, which is used for the formation of the thin film, is generally up to 1/1000, but this proportion can be altered by adjusting the mass spectrometer.

Figure 2A:
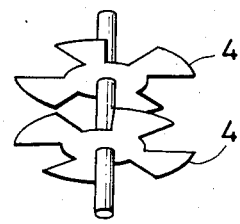
FIG. 2 is a perspective view showing a molecular beam speed selector.
Figure 2B:
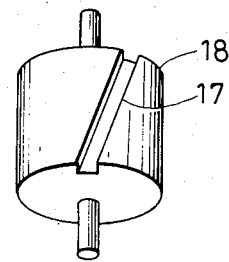

A molecular beam speed selector shown in FIG. 2 can be used in place of the chopper 4. FIG. 2(a) shows a speed selector of the type in which two choppers are rotated coaxially, while FIG. 2(b) shows a speed selector of the type which consists of a rotary cylindrical chopper 18 equipped with an inclined slit 17 on its side wall. When the rotation speed of either of the molecular beam speed selectors is changed, the molecular beam having a particular speed can be taken out by utilizing the gap defined by the deviation of the blades in the case of FIG. 2(a), and by utilizing the molecular beam passing through the slit 17 in the case of FIG. 2(b). Therefore, a uniform thin film having better microcrystallinity can be formed.

It is possible to calculate the flux and speed of the ionized molecular beam by introducing the molecular beam itself into an ionization chamber so as to ionize a part of the molecular beam without using the chopper described above. However, since background noise is great in this case, the accurate flux and speed of the molecular beam can not easily be determined. That is, the molecular beam does not move straight only into the aperture, and some of the beam impinge against, and are reflected from, the wall of the equipment, and enter the ionizer, thereby causing background noise. If the molecular beam is cut off to the pulsed molecular beam by the chopper, the molecular beam that is reflected from the wall and enters the ionization chamber comes to possess a time lag, so that it enters the ionization chamber while the pulsed molecular beam is cut off. Therefore, the background noise has already disappeared by the time when the pulsed molecular beam enters the ionization chamber, and the molecular beam flux can be measured more accurately.

It is generally preferred that the modulation frequency of the chopper be from 10 Hz to 1 KHz. It is also preferred that the chopper allows the passage of from about 99/100 to about 1/100 of the total molecular beam, and more preferably from about ½ to about 1/20. This arrangement can substantially eliminate the background noise described above. The passing quantity of the molecular beam can be determined by the size of the hole of the chopper. The speed of the molecular beam can not be measured in accordance with this system unless the chopper is used.

As described above, in a thin film formation technique and equipment for forming a thin film by sticking a molecule to a substrate, the thin film formation technique and equipment in accordance with the present invention converts the molecular beam effusing from the molecular beam source equipment to the pulsed molecular beam, then introduces the pulsed molecular beam into the ionization chamber so that most of the beam is caused to be incident to the substrate while a part is ionized by the ionization chamber, amplifies and converts to an electrical signal the ion or the electron converted from the ion, calculates the flux and speed of the molecular beam, controls the molecular beam effusing from the molecular beam source equipment on the basis of the information obtained by the calculation, and forms the intended thin film. Since the present invention controls the molecular beam effusing from the molecular beam source equipment while measuring the flux and speed of the molecular beam itself used for the formation of the thin film, the thickness of the resulting thin film can be controlled more easily, and a uniform thin film which is by far more excellent than those obtained by the prior art technique and equipment is provided. If the speed selector is used, only a molecular beam having a low speed can be used for the formation of the thin film, so that the sticking probability of the molecules onto the substrate can be increased, the crystallinity of the thin film can be improved and the thin film can be formed with a high level of resolution.

What is claimed is:

1. In a thin film formation technique which sticks molecules onto a substrate and forms a thin film, the thin film formation technique comprising the steps of:
    converting a molecular beam effusing from molecular beam source equipment to a pulsed molecular beam;
    introducing said pulsed molecular beam into an ionization chamber so that most of said pulsed molecular beam is caused to be incident on said substrate while a part of said pulsed molecular beam is ionized by said ionization chamber;
    amplifying the ion or the electron converted from the ion and converting it to an electrical signal;
    calculating the flux and speed of said molecular beam in accordance with the electrical signal;
    controlling said molecular beam effusing from said molecular beam source equipment on the basis of the calculation information of the flux and speed; and
    forming said thin film on said substrate.

2. The thin film formation technique according to claim 1, wherein said pulsed molecular beam has a period of from 10 Hz to 1 KHz.

3. In a thin film formation equipment which sticks a molecules onto a substrate and forms a thin film, the thin film formation equipment comprising:
    molecular beam source equipment for effusing a molecular beam;
    means for cutting the effused molecular beam at a high speed and converting it to a pulsed molecular beam;
    an ionization chamber for ionizing a part of said pulsed molecular beam;
    means for amplifying the ion or the electron converted from the ion and changing it to an electrical signal, and for calculating the flux and speed of said molecular beam; and
    feed-back means for feeding back the calculation information of the flux and speed to said molecular beam source equipment to control said molecular beam to enable formation of a thin film on the substrate.

4. The thin film formation equipment according to claim 3, wherein said ionization chamber is a mass spectrometer.

5. The thin film formation technique according to claim 2, wherein the step of converting a molecular beam to a pulsed molecular beam includes cutting the molecular beam and further comprising the step of detecting the timing of the molecular beam cutting by a photo-sensor.

6. The film formation technique according to claim 5, further comprising the step of selecting a molecular beam having a predetermined speed.

7. The thin film formation technique according to claim 2, wherein the step of introducing said pulsed molecular beam into the ionization chamber includes passing most of said pulsed molecular beam through the ionization chamber without being ionized by said ionization chamber so as to be incident on said substrate to form said thin film thereon.

8. The thin film formation equipment according to claim 3, wherein said cutting means cuts the molecular beam at a fixed speed corresponding to a predetermined period of said pulsed molecular beam selected to be in the range of 10 Hz–1 KHz.

9. The thin film formation equipment according to claim 3, further comprising a photo-sensor for detecting the timing of the cutting of said molecular beam by said cutting means.

10. The thin film formation equipment according to claim 3, further comprising means for selecting a speed for said molecular beam.

11. The thin film formation equipment according to claim 3, wherein said ionization chamber is disposed for receiving said pulsed molecular beam and for passing most of said pulsed molecular beam therethrough without ionization so as to be incident on said substrate to enable formation of a thin film thereon.

* * * * *